(12) United States Patent
Hwang et al.

(10) Patent No.: US 11,329,187 B2
(45) Date of Patent: May 10, 2022

(54) METHOD OF ALIGNING MICRO LEDS AND METHOD OF MANUFACTURING MICRO LED DISPLAY USING THE SAME

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Kyungwook Hwang, Hwaseong-si (KR); Jungel Ryu, Seoul (KR); Sungjin Kang, Seoul (KR); Jongmyeong Kim, Anyang-si (KR); Jehong Oh, Seoul (KR); Euijoon Yoon, Seoul (KR); Seungmin Lee, Seoul (KR); Junsik Hwang, Hwaseong-si (KR)

(73) Assignees: SAMSUNG ELECTRONICS CO., LTD., Seoul (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 53 days.

(21) Appl. No.: 16/883,363

(22) Filed: May 26, 2020

(65) Prior Publication Data

US 2021/0184070 A1     Jun. 17, 2021

(30) Foreign Application Priority Data

Dec. 13, 2019 (KR) .......................... 10-2019-0167141

(51) Int. Cl.
*H01L 33/00*     (2010.01)
*H01L 27/15*     (2006.01)

(52) U.S. Cl.
CPC .......... *H01L 33/005* (2013.01); *H01L 27/156* (2013.01); *H01L 2933/0041* (2013.01)

(58) Field of Classification Search
CPC ................. H01L 33/005; H01L 27/156; H01L 2933/0041
See application file for complete search history.

(56) References Cited

U.S. PATENT DOCUMENTS

| | | |
|---|---|---|
| 5,228,067 A | 7/1993 | Ito et al. |
| 7,589,001 B2 | 9/2009 | Tadatomo et al. |
| (Continued) | | |

FOREIGN PATENT DOCUMENTS

| | | |
|---|---|---|
| CN | 108461438 A | 8/2018 |
| JP | 3471700 B2 | 12/2003 |
| (Continued) | | |

*Primary Examiner* — Fernando L Toledo
*Assistant Examiner* — Neil R Prasad
(74) *Attorney, Agent, or Firm* — Sughrue Mion, PLLC

(57) ABSTRACT

A method of aligning micro LEDs and a method of manufacturing a micro LED display using the same are provided. The method of aligning micro LEDs includes providing micro LEDs, each having a first surface that has a first maximum width and a second surface opposite to the first surface and has a second maximum width that is greater than the first maximum width, providing a transfer substrate including a transfer mold that has an array of openings, each of the openings being configured to accommodate the first surface of a corresponding micro LED and not accommodate the second surface of the corresponding micro LED and aligning the micro LEDs in one direction in the openings of the transfer mold by inserting the micro LEDs into the openings of the transfer mold so that the first surface of each of the micro LEDs is positioned within a corresponding opening.

20 Claims, 18 Drawing Sheets

(56) References Cited

U.S. PATENT DOCUMENTS

| | | | |
|---|---|---|---|
| 9,287,479 B2 | 3/2016 | Kim | |
| 2014/0159066 A1* | 6/2014 | Hu | H01L 25/0753 257/88 |
| 2014/0340900 A1* | 11/2014 | Bathurst | B81C 99/002 362/249.02 |
| 2016/0181476 A1* | 6/2016 | Chang | H01L 25/0753 257/13 |
| 2017/0213938 A1 | 7/2017 | Bae et al. | |
| 2018/0190614 A1* | 7/2018 | Kumar | H01L 24/81 |
| 2020/0176634 A1* | 6/2020 | Batres | H01L 33/46 |

FOREIGN PATENT DOCUMENTS

| | | |
|---|---|---|
| JP | 2005107906 A | 4/2005 |
| JP | 2005183573 A | 7/2005 |
| KR | 19930005232 A | 3/1993 |
| KR | 100622818 B1 | 9/2006 |
| KR | 1020090113223 A | 10/2009 |

* cited by examiner

METHOD OF ALIGNING MICRO LEDS AND METHOD OF MANUFACTURING MICRO LED DISPLAY USING THE SAME

CROSS-REFERENCE TO RELATED APPLICATION

This application claims priority to Korean Patent Application No. 10-2019-0167141, filed on Dec. 13, 2019, in the Korean Intellectual Property Office, the disclosure of which is incorporated herein in its entirety by reference.

BACKGROUND

1. Field

Example embodiments consistent with the present disclosure relate to methods of aligning micro LEDs and methods of manufacturing a micro LED display using the same.

2. Description of Related Art

Various displays such as liquid crystal displays (LCDs) and organic light-emitting diode (OLED) displays are widely used. Recently, a technology for manufacturing a high-resolution display using micro-light emitting diodes (micro-LEDs) has attracted attention. A method of arranging high-efficiency micro LEDs of a micro-chip type at appropriate positions on a substrate through a transfer process is used to manufacture high-resolution displays.

SUMMARY

Provided are methods of aligning micro LEDs in one direction through a transfer process and methods of manufacturing a micro LED display using the same.

Additional aspects will be set forth in part in the description which follows and, in part, will be apparent from the description, or may be learned by practice of the presented embodiments of the disclosure.

According to an aspect of the disclosure, there is provided a method of aligning light-emitting diodes (LEDs), the method comprising: providing micro LEDs, each of the micro LEDs having a first surface that has a first maximum width D1 and a second surface that is opposite to the first surface and has a second maximum width D2 that is greater than the first maximum width D1; providing a transfer substrate including a transfer mold that has an array of openings, each of the openings being configured to accommodate the first surface of a corresponding micro LED and not accommodate the second surface of the corresponding micro LED; and aligning the micro LEDs in one direction in the openings of the transfer mold by inserting the micro LEDs into the openings of the transfer mold so that the first surface of each of the micro LEDs is positioned within a corresponding opening.

The aligning of the micro LEDs in the one direction in the openings of the transfer mold may be repeated until none of the openings are empty or until none of the micro LEDS are misaligned with respect to the openings.

The aligning of the micro LEDs in the one direction in the openings of the transfer mold may comprise removing at least one micro LED that is misaligned.

A third maximum width of each of the openings may be less than the second maximum width D2 of the second surface of each of the micro LEDs.

A depth of each of the openings may be less than a thickness of each of the micro LEDs.

A shape of a cross-section of each of the openings may correspond to a shape of a cross-section of each of the micro LEDs.

Each of the micro LEDs may have a slanted side surface connecting the first surface and the second surface.

Each of the micro LEDs may have a core-shell structure.

The slanted side surface of each of the micro LEDs may have an inclination angle of about 58 degrees or about 62 degrees.

A maximum width of each of the micro LEDs taken along an intermediate thickness cross-section thereof may be Dc, a maximum width of each of the openings may be Dt, and the micro LEDs and the openings may satisfy: D1<Dc<Dt≤D2 and 0<Dt−Dc<D2−Dc.

Each of the openings may further configured to accommodate the corresponding micro LED to a depth equivalent to at least half a thickness of the corresponding micro LED.

A thickness of each of the micro LEDs from the first surface to the second surface may be $H_{LED}$, and a value $(D2-Dc)/H_{LED}$ may be about 0.312435 or about 0.265855.

The micro LEDs may be micro LED flakes, and wherein the aligning of the micro LEDs may comprise placing the micro LED flakes on the transfer substrate so that the first surface of each of the micro LED flakes is inserted into the corresponding opening of the transfer mold.

According to another aspect of the disclosure, there is provided a method of manufacturing a light-emitting diode (LED) display, the method comprising: forming a display including unit pixels by aligning micro LEDs in one direction on a transfer substrate, the aligning the micro LEDs comprising: providing the micro LEDs, each of the micro LEDs having a first surface that has a first maximum width D1 and a second surface that is opposite to the first surface and has a second maximum width D2 that is greater than the first maximum width D1; providing the transfer substrate including a transfer mold that has an array of openings, each of the openings being configured to accommodate the first surface of a corresponding micro LED and not accommodate the second surface of the corresponding micro LED; and aligning the micro LEDs in the one direction in the openings of the transfer mold by inserting the micro LEDs into the openings of the transfer mold so that the first surface of each of the micro LEDs is positioned within a corresponding opening.

The method may further comprise forming, on the openings of the transfer mold in which the micro LEDs are aligned, a color conversion layer for converting a wavelength of light emitted by the micro LEDs, wherein the transfer substrate may be a display substrate.

The color conversion layer may be formed so that each of the unit pixels includes a plurality of pixels of different colors.

According to another aspect of the disclosure, there is provided a method of manufacturing a light-emitting diode (LED) display, the method comprising: providing micro LEDs, each of the micro LEDs having a first surface that has a first maximum width D1 and a second surface that is opposite to the first surface and has a second maximum width D2 that is greater than the first maximum width D1; providing a transfer substrate including a transfer mold that has an array of openings, each of the openings being configured to accommodate the first surface of a corresponding micro LED and not accommodate the second surface of the corresponding micro LED; aligning the micro LEDs in one direction in the openings of the transfer mold by inserting the micro LEDs into the openings of the transfer mold so that the first surface of each of the micro LEDs is positioned within a corresponding opening; and forming a plurality of unit pixels by transferring the micro LEDs aligned in the one direction on the transfer substrate to a display substrate through bonding.

The method may further comprise forming, on the display substrate to which the micro LEDs are transferred, a color conversion layer for converting a wavelength of light emitted by the micro LEDs.

The color conversion layer may be formed so that each of the unit pixels includes a plurality of pixels of different colors.

According to another aspect of the disclosure, there is provided a micro light-emitting diode (LED) display comprising: micro LEDs, each of the micro LEDs having a first surface that has a first maximum width D1 and a second surface that is opposite to the first surface and has a second maximum width D2; and a transfer substrate including a transfer mold that has an array of openings, each of the openings being configured to accommodate the first surface of a corresponding micro LED and not accommodate the second surface of the corresponding micro LED, and the micro LEDS being inserted and aligned in one direction in the openings of the transfer mold so that the first surface of each of the micro LEDs is positioned within a corresponding opening, wherein a third maximum width of each of the micro LEDs along an intermediate thickness cross section thereof is Dc, and a fourth maximum width of each of the openings is Dt, wherein the micro LEDs and the openings satisfy: D1<Dc<Dt<D2 and 0<Dt−Dc<D2−Dc, and wherein the transfer substrate is a display substrate configured to form a plurality of unit pixels.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION

Figure 1:
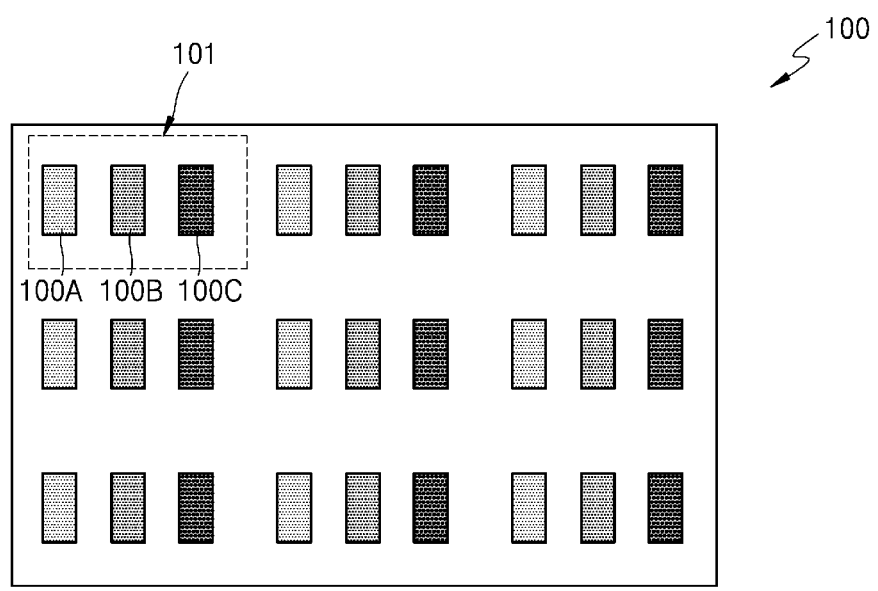
FIG. 1 is a plan view schematically illustrating a pixel arrangement of a micro LED display according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

When an element is referred to as being "on" another element, it may be directly on the other element in contact with the other element or may be on the other element without contacting the other element. The terms "first", "second" and the like may be used for describing various elements, but are used only for distinguishing one element from other elements. Such terms do not indicate that elements have different materials or structures. The terms of a singular form may include plural forms unless otherwise specified. When it is mentioned that a certain part "includes" or "comprises" certain elements, the part may further include other elements, unless otherwise specified. The singular forms "a", "an", and "the" used in the disclosure may be intended to include the plural forms as well.

FIG. 1 is a plan view schematically illustrating a pixel arrangement of a micro light-emitting diode (LED) display 100 according to an example embodiment.

Referring to FIG. 1, the micro LED display 100 includes a plurality of unit pixels 101. For convenience, FIG. 1 illustrates nine unit pixels 101. Here, each of the plurality of unit pixels 101 may have pixels of different colors so that the display 100 may implement a color image. For example, each of the unit pixels 101 may include first, second, and third pixels 100A, 100B, and 100C of different colors. In more detail, the first, second, and third pixels 100A, 100B, and 100C may be blue, green, and red pixels. However, an embodiment is not limited thereto.

Figure 2:
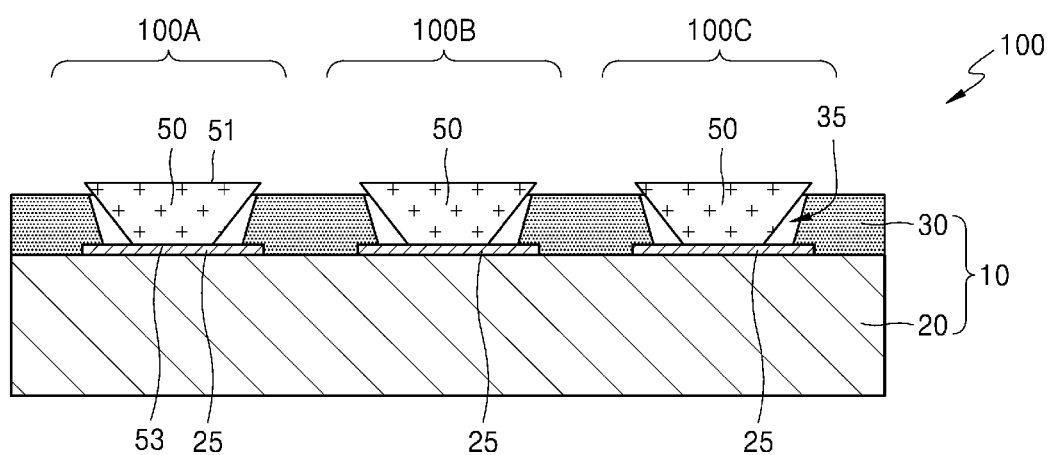
FIG. 2 schematically illustrates a configuration of a micro LED display according to an example embodiment.

FIG. 2 schematically illustrates a configuration of the micro LED display 100 according to an example embodiment.

Referring to FIG. 2, the micro LED display 100 may include a transfer substrate 10 in which a transfer mold 30 having an array of openings 35 is formed, and a plurality of micro LEDs 50 aligned in the openings 35 of the transfer mold 30. FIG. 2 illustrates that the transfer substrate 10 is a display substrate as an example, but the transfer substrate 10 may also be used only for aligning the micro LEDs 50 in the openings 35 of the transfer mold 30 without misalignment.

The transfer substrate 10 may include a substrate 20 and the transfer mold 30 having the array of openings 35 formed on the substrate 20. The substrate 20 may include, for example, a glass substrate 20 or silicon substrate 20. However, this is merely an example, and thus the substrate 20 including other various materials may be used. Driver circuits 25 for driving the plurality of micro LEDs 50 may be provided on the substrate 20.

The transfer mold 30 may be provided on an upper surface of the substrate 20. The transfer mold 30 may be provided so that the micro LEDs 50 are placed one by one in the openings 35 during a process of transferring the micro LEDs 50 to the transfer substrate 10 so as to form an array corresponding to a pixel array.

The openings 35 for accommodating the micro LEDs 50 may be formed in the transfer mold 30, and the transfer mold 30 may include, for example, a polymer. In more detail, the transfer mold 30 may include photoresist. According to an example embodiment, the transfer mold 30 may be formed through photoresist patterning, etching, molding, or the like, but the process of forming the transfer mold 30 is not limited thereto.

The micro LEDs 50, which are light-emitting diodes, may be manufactured in a form of a microscale chip. Each of the micro LEDs 50 may form one pixel in the micro LED display 100.

Figure 3A:
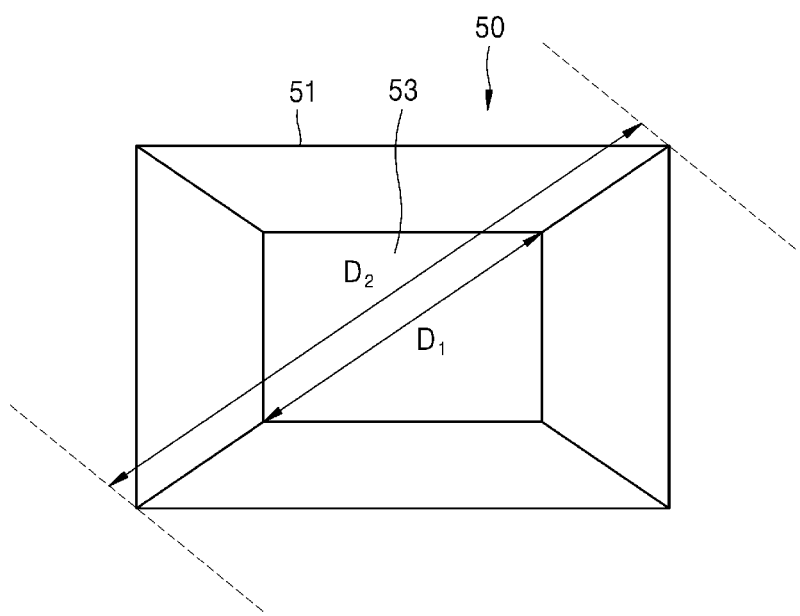
FIGS. 3A and 3B are respectively a plan view and side view of a micro LED according to an example embodiment.
Figure 3B:
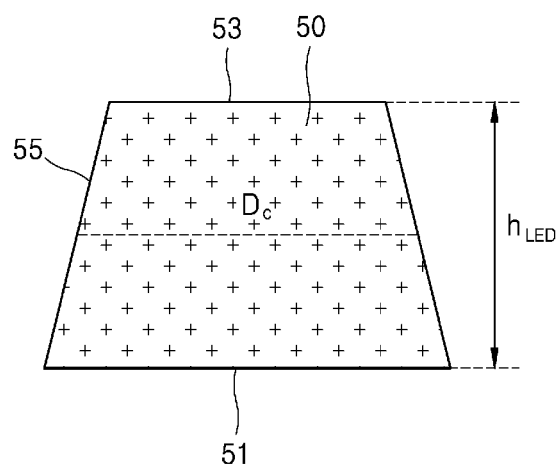

FIGS. 3A and 3B are a plan view and side view of the micro LED 50 according to an example embodiment. In the example embodiment, the micro LED 50 may have a first surface 53 and a second surface 51 on an opposite side to the first surface 53, and may have a slanted surface 55 that is inclined with respect to the first surface 53 and the second surface 51.

As illustrated in FIGS. 3A and 3B, when a maximum width of the first surface 53 of the micro LED 50 is D1 and a maximum width of the second surface 51 is D2, the maximum width D2 of the second surface 51 may be greater than the maximum width D1 of the first surface 53. For example, referring to FIG. 3A, when the first and second surfaces 53 and 51 have a rectangular shape, the maximum width D1 may correspond to a diagonal width of the first surface 53, and the maximum width D2 may correspond to a diagonal width of the second surface 51. Referring to FIG. 3B, when the micro LED 50 has the slanted surface 55 that is inclined with respect to the first surface 53 and the second surface 51, and has a thickness of $h_{LED}$, a maximum width Dc of the micro LED 50 taken along an intermediate thickness cross section thereof may satisfy an inequality D1<Dc<D2. According to an example embodiment, the intermediate thickness cross section is the midpoint in the thickness direction between the first surface 53 and the second surface 51.

In the example embodiment, the maximum widths D1, D2 of the first surface 53 and the second surface 51 of the micro LED 50 may vary with an inclination angle of the slanted surface 55 and the thickness (height) of the micro LED 50. Although FIGS. 3A and 3B illustrate the first surface 53 or the second surface 51 of the micro LED 50 as being rectangular, this is merely an example, and thus a cross section of the micro LED 50 may have various shapes such as trapezoid, rectangle, circle, hexagon, etc.

The micro LED 50, for example, may have a core-shell structure. That is, in the micro LED 50, a first semiconductor layer, an active layer, and a second semiconductor layer that form a light emission layer may form a core-shell structure, and electrodes may be formed in direct contact with each of the first semiconductor layer and the second semiconductor layer. The widths of the first surface 53 and the second surface 51 and a ratio between the first surface 53 and the second surface 51 may be determined according to a side surface growth rate and growth time of the micro LED 50 formed to have a core-shell structure. The micro LED 50 having a core-shell structure may have a structure in which the slanted surface 55 forms, for example, an angle of from about 58 degree to about 62 degrees. For, example, the micro LED 50 having a core-shell structure may have a structure in which the slanted surface 55 forms an angle of about 58 degree or about 62 degree.

The micro LED 50, for example, may be formed as a three-dimensional core-shell structure by forming at least one crystallized membrane on the substrate 20, and sequentially depositing and growing layers including the first semiconductor layer, the active layer, and the second semiconductor layer on the membrane. When the three-dimensional micro LED 50 is formed as a core-shell structure by applying the membrane, a cutting process for forming a separate chip of the micro LED 50 is not necessary, and thus a defect may be minimized and a current leakage may be prevent, thereby enabling efficient light emission.

According to another example embodiment, the micro LED 50 may be formed as a structure in which the first semiconductor layer, the active layer, and the second semiconductor layer are sequentially stacked on the substrate 20, the structure having the first surface 53 and the second surface 51 on the opposite side to the first surface 51 and having the slanted surface 55 that is inclined with respect to the first surface 53 and the second surface 51.

According to an example embodiment, a cross section of the opening 35 of the transfer mold 30 may be formed to have a shape corresponding to the shape of the cross section of the micro LED 50. For example, the cross section of the opening 35 of the transfer mold 30 may be formed to have various shapes such as trapezoid, rectangle, circle, hexagon, etc. according to the shape of the micro LED 50.

Figure 4:
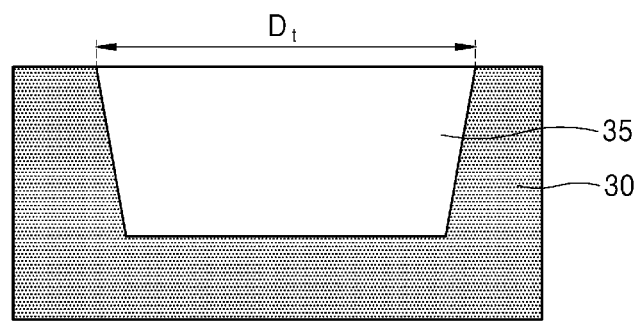
FIG. 4 illustrates an example of an opening of a transfer mold according to an example embodiment.
Figure 5:
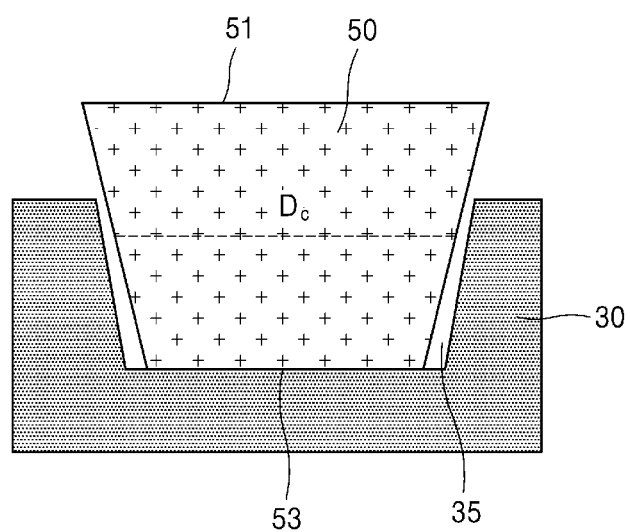
FIG. 5 illustrates an example of a state in which a micro LED is aligned in an opening of a transfer mold according to an example embodiment.

FIG. 4 illustrates the opening 35 of the transfer mold 30 according to an example embodiment, and FIG. 5 illustrates a state in which the micro LED 50 is aligned in the opening 35 of the transfer mold 30 according to an example embodiment.

Referring to FIG. 4, a maximum width Dt of the opening 35 of the transfer mold 30 may be less than the maximum width D2 of the second surface 51 of the micro LED 50.

Furthermore, referring to FIG. 5, a depth of the opening 35 may be less than the thickness of the micro LED 50. Although FIGS. 4 and 5 illustrate that the opening 35 of the transfer mold 30 is formed to have slanted surfaces so that an upper end of the opening 35 has the maximum width Dt, according to another example embodiment, the opening 35 of the transfer mold 30 may be formed so that the opening 35 does not have a slanted surface, and there is no substantial change in a cross-sectional area of the opening 35.

The micro LED 50 and the opening 35 of the transfer mold 30 may be formed so as to satisfy, for example, an inequality D1<Dc<Dt<D2. That is, the micro LED 50 and the opening 35 of the transfer mold 30 may be formed so as to satisfy an inequality 0<Dt−Dc<D2−Dc. Furthermore, when the thickness of the micro LED 50 is $H_{LED}$, the micro LED 50 may be formed to satisfy an inequality 0<(Dt−Dc)/$H_{LED}$<(D2−Dc)/$H_{LED}$, wherein a value of (D2−Dc)/$H_{LED}$ may be a constant value. For example, the value of (D2−Dc)/$H_{LED}$ may be a constant value within a range of from about 0.26 to about 0.32. For example, the value of (D2−Dc)/$H_{LED}$ may be about 0.265855 or about 0.312435.

By forming the micro LED 50 and the opening 35 of the transfer mold 30 to satisfy such conditions, the micro LED 50 may be accommodated in the opening 35 of the transfer mold 30 to a depth equivalent to at least half the thickness of the micro LED 50 as illustrated in FIG. 5. Furthermore, the micro LED 50 is inserted into the opening 35 of the transfer mold 30 such that only a partial thickness of the micro LED 50 including the first surface 53 may be inserted into the opening 35, and the second surface 51 is not inserted into the opening 35, thereby preventing misalignment such as the case where the micro LED 50 is reversely inserted into the opening 35. Accordingly, the plurality of micro LEDs 50 may be aligned in one direction. For example, the plurality of micro LEDs 50 may be aligned in a direction in which the first surface is inserted into the opening 35 of the transfer mold 30.

Figure 9:
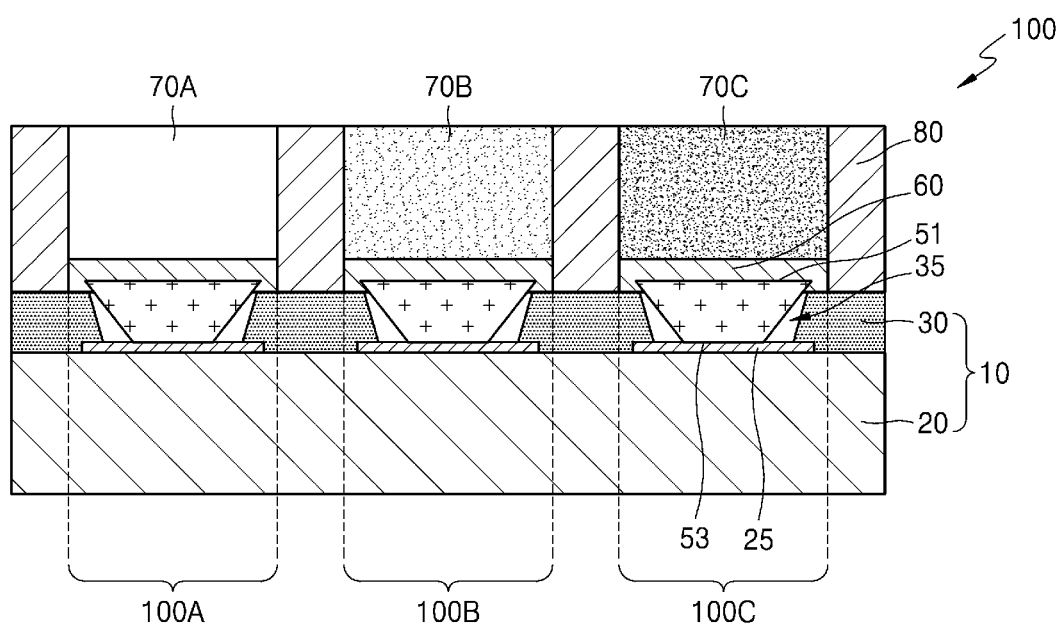

According to an example embodiment, in a state in which the micro LEDs 50 are arranged in one direction on the transfer substrate 10, the micro LED display 100 may further include a partition wall 80 formed on the transfer mold 30 to accommodate a light emission region of a pixel, and a filling layer 60 and color conversion layers 70A, 70B, and 70C burying the micro LED 50 in the light emission region of a pixel as illustrated in FIG. 9. The partition wall 80, the filling layer 60, and the color conversion layers 70A, 70B, and 70C are omitted in FIGS. 1 and 2 to more clearly illustrate a state in which the micro LED 50 is aligned in the opening 35 of the transfer mold 30, and the partition wall 80, the filling layer 80, and the color conversion layers 70A, 70B, and 70C will be described later with reference to FIG. 9.

Hereinafter, a method of aligning the micro LED 50 and a method of manufacturing the micro LED display 100 using the same according to an example embodiment will be described.

FIGS. 6 to 9 illustrate a method of aligning the micro LED 50 according to an example embodiment and a method of manufacturing the micro LED display 100 using the same. FIGS. 6 to 9 illustrate an example embodiment in which the driver circuit 25 is formed on the transfer substrate 10 so that the transfer substrate 10 is used as a display substrate. Here, the same elements as illustrated in FIGS. 1 to 5 are referred to as the same reference signs, and repeated descriptions will be omitted if possible.

Figure 6:
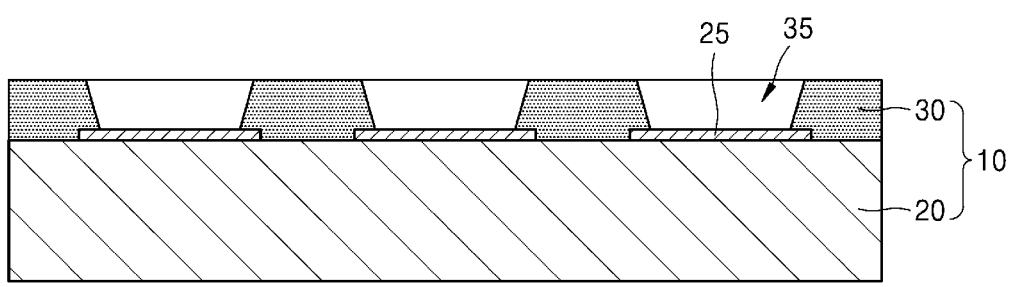
FIGS. 6 to 9 illustrate a method of aligning micro LEDs and a method of manufacturing a micro LED display using the same according to an example embodiment.

Referring to FIG. 6, the transfer substrate 10 in which the transfer mold 30 is formed is prepared. According to an example embodiment, the transfer mold 30 may have an array of openings 35 that are capable of accommodating the first surface 53 of the micro LED 50 and do not accommodate the second surface 51 of the micro LED 50. According to an example embodiment, the transfer mold 30 may be formed on the substrate 20, and the driver circuit 25 for driving the micro LED 50 may be formed on the substrate 20.

Figure 7A:
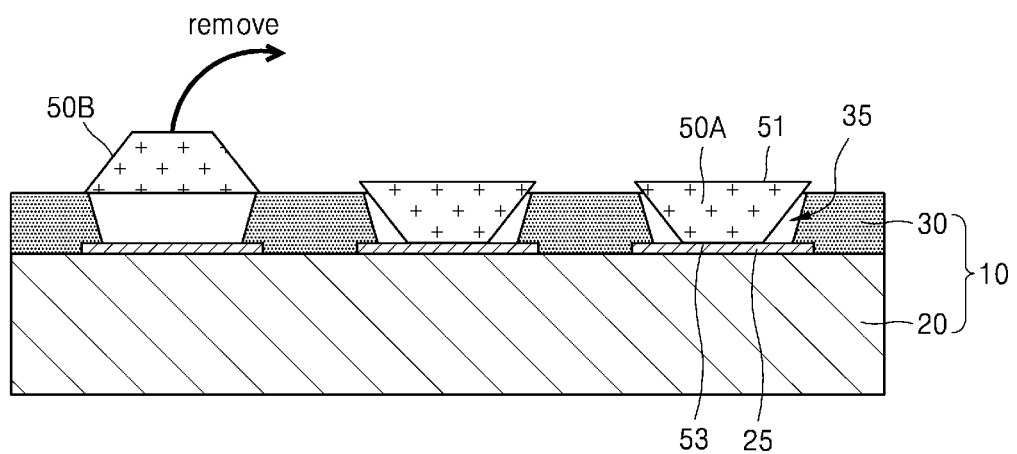
Figure 7B:
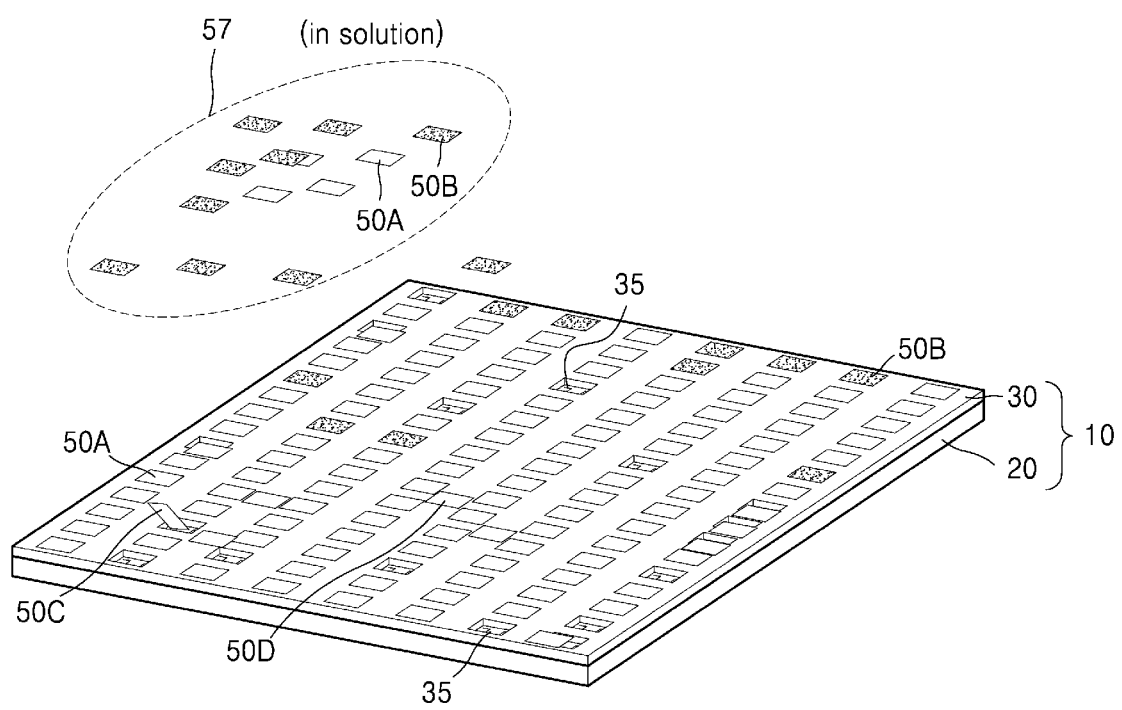
Figure 8A:
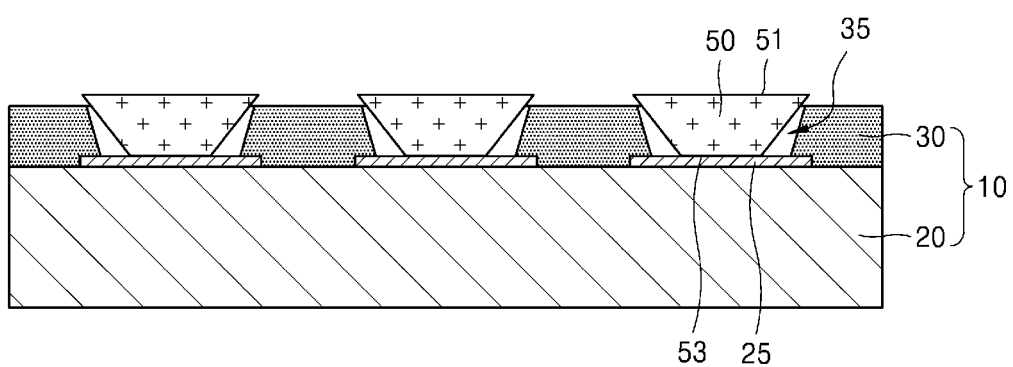
Figure 8B:
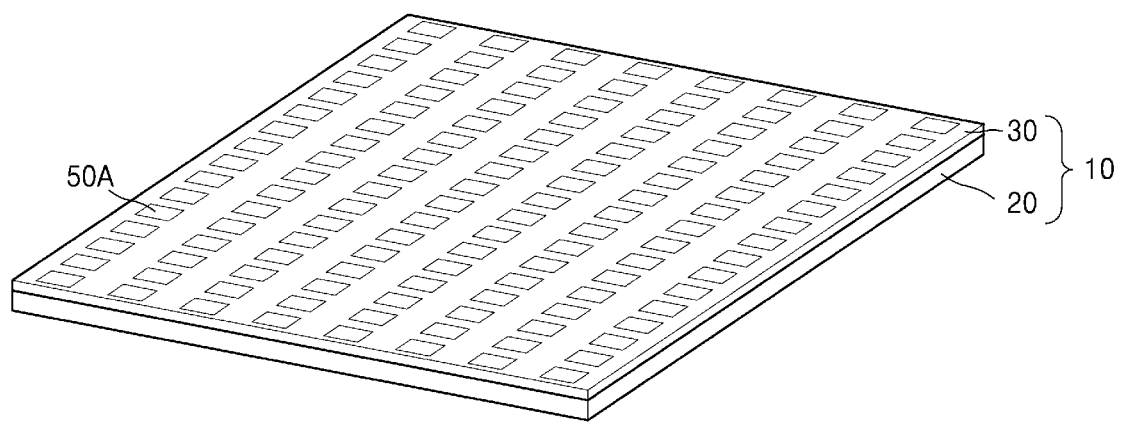

Next, FIGS. 7A, 7B, 8A, and 8B illustrate a process of aligning the micro LEDs 50 in the openings 35 of the transfer mold 30 so that the first surface 53 of each of the micro LEDs 50 is positioned and aligned within the opening 35. FIGS. 7A and 7B exemplarily illustrate occurrence of misalignment of the micro LED 50. FIGS. 8A and 8B illustrate a state in which the micro LEDs 50 are aligned in the openings 35 of the transfer mold 30 in one direction without misalignment.

The process of aligning the micro LEDs 50 in the openings 35 of the transfer mold 30 in one direction may be performed at least one time until an empty opening 35 is not present or misalignment does not occur, in which the first surface 53 of the micro LED 50 is placed without being inserted into the opening 35 or is placed on an upper surface of the transfer mold 30.

As illustrated in FIG. 7B, the micro LEDs 50 may be prepared in a state of suspension 57 in which micro LED flakes are dispersed. The suspension 57 in which the micro LED flakes are dispersed may be applied on the transfer substrate 10 so that the micro LEDs 50 may be aligned with the first surface 53 thereof being inserted into the opening 35 of the transfer mold 30.

In FIG. 7B, reference sign 50A indicates a micro LED which is correctly aligned with the first surface 53 thereof being inserted into the opening 35 (as illustrated in FIG. 7A), reference sign 50B indicates a micro LED which is misaligned since the first surface 53 thereof is reversely placed and oriented upwards (as illustrated in FIG. 7A), reference sign 50C indicates a micro LED which is misaligned since only a part thereof is inserted into the opening 35, and reference sign 50D indicates a micro LED of a dummy state, which is positioned outside the opening 35. Furthermore, there may be an empty opening 35 in which a micro LED is not inserted.

Here, a process of removing a misaligned or dummy-state micro LED 50 after applying, on the transfer substrate 10, the suspension 57 in which the micro LED flakes are dispersed, and reapplying the suspension 57 in which the micro LED flakes are dispersed on the transfer substrate 10 may be performed repeatedly until the micro LEDs 50 are aligned in one direction in all of the openings 35.

Although FIG. 7B exemplarily illustrates that the micro LED flakes are applied on the transfer substrate 10 in a state of a suspension, the micro LED flakes may be applied on the transfer substrate 10 using a dry method. Even when applying the micro LED flakes on the transfer substrate 10 using a dry method, the process of removing a misaligned or dummy-state micro LED 50 after applying the micro LED flakes on the transfer substrate, and reapplying the micro LED flakes on the transfer substrate 10 may be performed repeatedly until the micro LEDs 50 are aligned in one direction in all of the openings 35.

As described above, the micro LED flakes may be prepared in a wet state (i.e., in solution) such as the suspension 57 or in a dry state, and the micro LED flakes may be applied on the transfer substrate 10 so that the micro LEDs 50 may be aligned with a state in which the first surface 53 thereof is inserted into the opening 35 of the transfer mold 30.

As described above, the process of removing a misaligned or dummy-state micro LED 50 after applying the micro LED flakes on the transfer substrate 10, and reapplying the micro LED flakes on the transfer substrate 10 may be performed repeatedly until the micro LEDs 50 are aligned in one direction in all of the openings 35 as illustrated in FIGS. 8A and 8B.

As described above, by forming the micro LEDs 50 and the openings 35 of the transfer mold 30 so as to satisfy, for example, the inequality D1<Dc<Dt<D2, the micro LEDs 50 may be aligned in one direction in all of the openings 35 through a simple process of applying the micro LED flakes on the transfer substrate 10.

To manufacture the micro LED display 100 by using the transfer substrate 10 as a display substrate in a state in which the micro LEDs 50 are aligned in one direction on the transfer substrate 10 as described above, the partition wall 80 which accommodates a light emission region of a pixel may be formed on the transfer mold 30, and the filling layer 60 and the color conversion layers 70A, 70B, and 70C burying the micro LED 50 may be formed in the light emission region of a pixel as illustrated in FIG. 9. The filling layer 60 may include a material that transmits light emitted from the micro LED 50. The partition wall 80 may be formed to prevent crosstalk from occurring between adjacent pixels. The partition wall 80 may be formed of an opaque material. Also, the partition wall 80 may be formed of a transparent material, for example, the same transparent material as that of the filling layer 60, and a reflective film (not shown) may be formed on an inner wall of the partition wall 80.

The color conversion layers 70A, 70B, and 70C may include, for example, first to third color conversion layers 70A, 70B, and 70C to form a unit pixel including first to third pixels 100A, 100B, and 100C of different colors. For another example, the color conversion layers 70A, 70B, and 70C may include, for example, one transparent material layer and two color conversion layers to form a unit pixel including the first to third pixels 100A, 100B, and 100C of different colors.

For example, light emitted from the micro LED 50 may be light of a shorter wavelength band than that of blue light, such as an ultraviolet wavelength band. In this case, the first color conversion layer 70A may be formed to convert light emitted from the micro LED 50 into first-color light, for example, blue light. The second color conversion layer 70B may be formed to convert light emitted from the micro LED 50 into second-color light, for example, green light. The third color conversion layer 70C may be formed to convert light emitted from the micro LED 50 into third-color light, for example, red light. The first to third color conversion layers 70A, 70B, and 70C may include, for example, quantum dots (QDs) to convert light input from the micro LED 50 into the first-color light to third-color light, but an embodiment is not limited thereto.

For another example, light emitted from the micro LED 50 may be, for example, blue light. In this case, the first color conversion layer 70A may correspond to a transparent material layer, or may be provided as a color conversion layer to increase color purity of the first pixel. The second color conversion layer 70B may be formed to convert the blue light emitted from the micro LED 50 into second-color light, for example, green light. The third color conversion layer 70C may be formed to convert the blue light emitted from the micro LED 50 into third-color light, for example, red light. The second and third color conversion layers 70B and 70C may include, for example, QDs to convert light input from the micro LED 50 into the second-color light and third-color light, but an embodiment is not limited thereto. When a color conversion layer rather than a transparent material layer is provided as the first color conversion layer 70A corresponding to the first pixel 100A, the first color conversion layer 70A may include, for example, QDs to increase color purity of first-color light, for example, blue light in the first pixel 100A, but an embodiment is not limited thereto.

An example embodiment in which the transfer substrate 10 on which the transfer mold 30 is formed is applied as the display substrate 20 has been described by giving examples and with reference to the drawings, but the disclosure is not limited thereto. Thus, a display substrate may be used separately from the transfer substrate 10 when manufacturing a micro LED display by using the method of aligning the micro LED 50 according to an embodiment.

FIGS. 10 to 15 illustrate a method of aligning the micro LED 50 according to another example embodiment and a method of manufacturing the micro LED display 200 using the same. FIGS. 10 to 15 illustrate an example embodiment in which a display substrate 120 is used separately from a transfer substrate 110. Here, the same elements as illustrated in FIGS. 1 to 9 are referred to as the same reference signs, and repeated descriptions will be omitted if possible.

Figure 10:
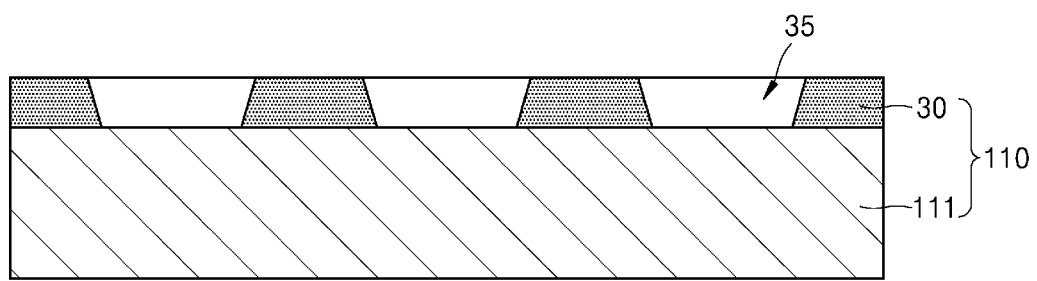
FIGS. 10 to 15 illustrate a method of aligning micro LEDs and a method of manufacturing a micro LED display using the same according to another example embodiment.

Referring to FIG. 10, the transfer substrate 110 in which the transfer mold 30 is formed is prepared, the transfer mold 30 having an array of openings 35 that are capable of accommodating the first surface 53 of the micro LED 50 and do not accommodate the second surface 51 of the micro LED 50. The transfer mold 30 may be formed on a substrate 111.

Figure 11:
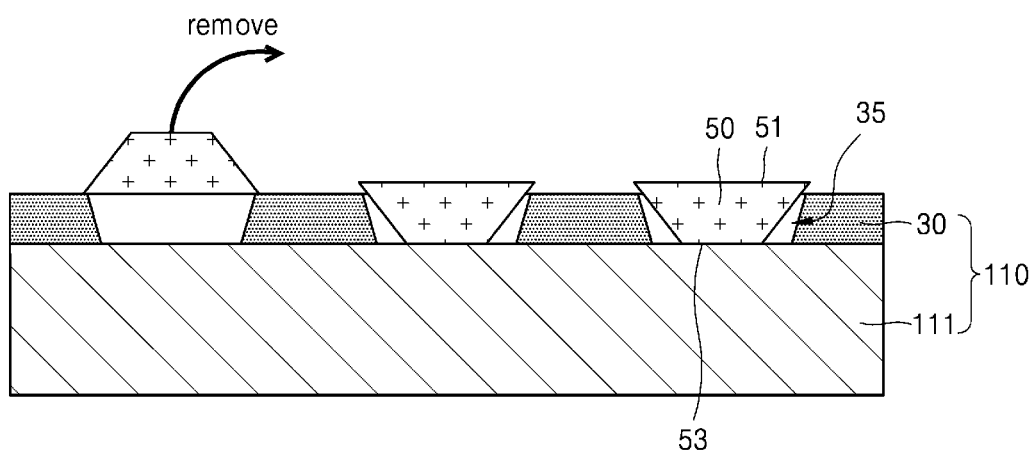
Figure 12:
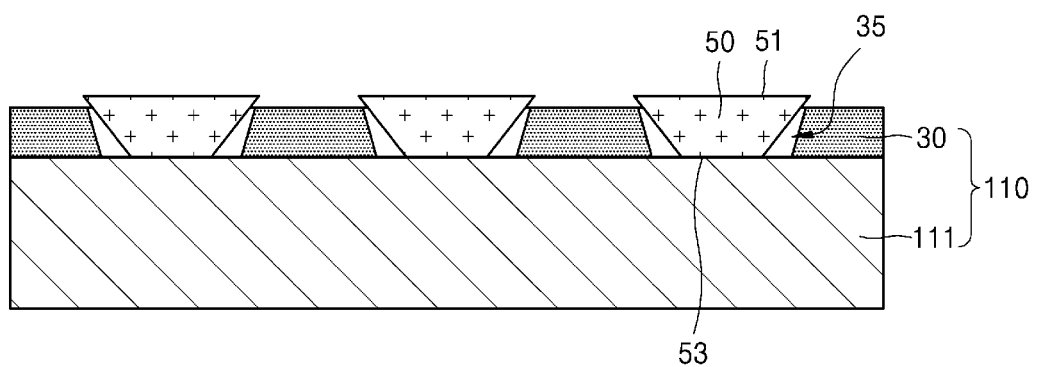

Next, as illustrated in FIGS. 11 and 12, a process of aligning the micro LEDs 50 in the openings 35 of the transfer mold 30 is performed so that the first surface 53 of each of the micro LEDs 50 is positioned and aligned within the opening 35. FIG. 11 illustrates exemplarily occurrence of misalignment of the micro LED 50. FIG. 12 illustrates a state in which the micro LEDs 50 are aligned in the openings 35 of the transfer mold 30 in one direction without misalignment.

The process of aligning the micro LEDs 50 in the openings 35 of the transfer mold 30 in one direction as illustrated in FIGS. 11 and 12 may be performed repeatedly until an empty opening 35 is not present or misalignment does not occur, in which the first surface 53 of the micro LED 50 is placed without being inserted into the opening 35 or is placed on the upper surface of the transfer mold 30, as described above with reference to FIGS. 7A to 8B. To this end, as described above with reference to FIG. 7B, micro LED flakes may be prepared in a wet state such as a suspension or in a dry state to prepare the micro LEDs 50. The micro LED flakes may be applied on the transfer substrate 110 so that the micro LEDs 50 may be aligned with the first surface 53 thereof being inserted into the opening 35 of the transfer mold 30. The process of removing a misaligned or dummy-state micro LED 50 after applying the micro LED flakes on the transfer substrate 110, and reapplying the micro LED flakes on the transfer substrate 110 may be performed repeatedly until the micro LEDs 50 are aligned in one direction in all of the openings 35 as illustrated in FIG. 12.

As described above, by forming the micro LEDs 50 and the openings 35 of the transfer mold 30 so as to satisfy, for example, the inequality D1<Dc<Dt<D2, the micro LEDs 50 may be aligned in one direction in all of the openings 35 through a simple process of applying the micro LED flakes on the transfer substrate 110.

Figure 13:
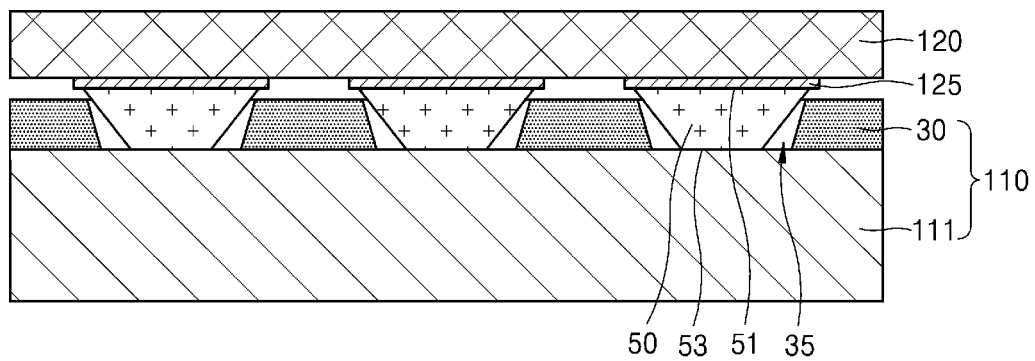
Figure 14:
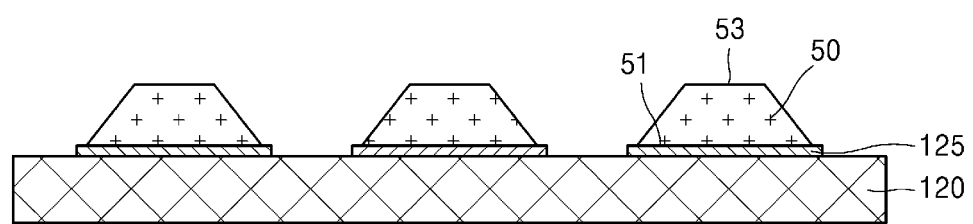

In a state in which the micro LEDs 50 are aligned in one direction on the transfer substrate 110 as described above, the micro LEDs 50 aligned in one direction on the transfer substrate 110 may be transferred to the display substrate 120, in which the driver circuit 125 is formed, through bonding, for example, metal bonding as illustrated in FIG. 13, so as to form an array of the micro LEDs 50 aligned in one direction on the display substrate 120 as illustrated in FIG. 14.

Figure 15:
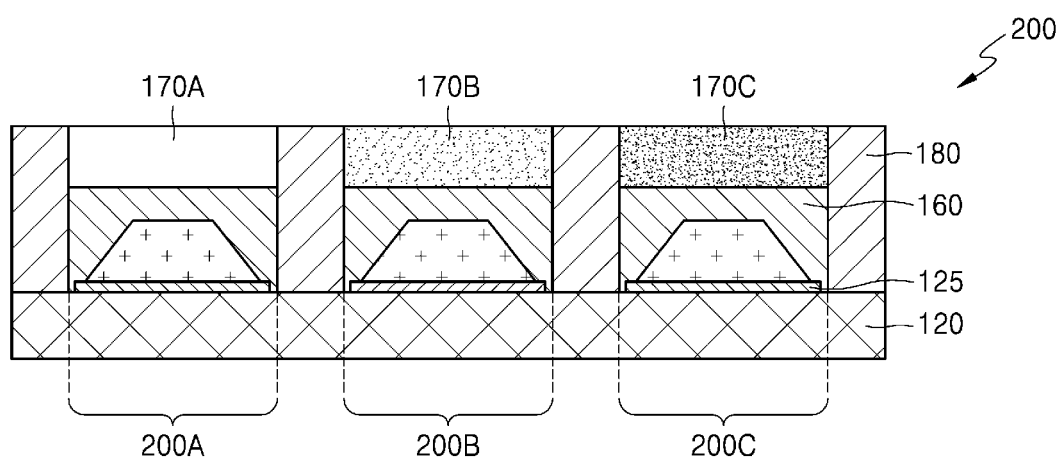

Next, to manufacture the micro LED display 200, a partition wall 180 which accommodates a light emission region of a pixel may be formed on the display substrate 120, and a filling layer 160 and color conversion layers 170A, 170B, and 170C burying the micro LED 50 may be formed in the light emission region of a pixel as illustrated in FIG. 15. The filling layer 160 may include a material that transmits light emitted from the micro LED 50. The partition wall 180 may be formed to prevent crosstalk from occurring between adjacent pixels. The partition wall 180 may be formed of an opaque material or may be formed of a transparent material, for example, the same transparent material as that of the filling layer 160, and a reflective film (not shown) may be formed on an inner wall of the partition wall 180.

The color conversion layers 170A, 170B, and 170C may include, for example, first to third color conversion layers 170A, 170B, and 170C to form a unit pixel including first to third pixels 200A, 200B, and 200C of different colors. For another example, the color conversion layers 170A, 170B, and 170C may include, for example, one transparent material layer and two color conversion layers to form a unit pixel including the first to third pixels 200A, 200B, and 200C of different colors.

For example, light emitted from the micro LED 50 may be light of a shorter wavelength band than that of blue light, for example, an ultraviolet wavelength band. In this case, the first color conversion layer 170A may be formed to convert light emitted from the micro LED 50 into first-color light, for example, blue light. The second color conversion layer 170B may be formed to convert light emitted from the micro LED 50 into second-color light, for example, green light. The third color conversion layer 170C may be formed to convert light emitted from the micro LED 50 into third-color light, for example, red light. The first to third color conversion layers 170A, 170B, and 170C may include, for example, QDs to convert light input from the micro LED 50 into the first-color light to third-color light, but an embodiment is not limited thereto.

For another example, light emitted from the micro LED 50 may be, for example, blue light. In this case, the first color conversion layer 170A may correspond to a transparent material layer, or may be provided as a color conversion layer to increase color purity of the first pixel 200A. The second color conversion layer 170B may be formed to convert the blue light emitted from the micro LED 50 into second-color light, for example, green light. The third color conversion layer 170C may be formed to convert the blue light emitted from the micro LED 50 into third-color light, for example, red light. The second and third color conversion layers 170B and 170C may include, for example, QDs to convert light input from the micro LED 50 into the second-color light and third-color light, but an embodiment is not limited thereto. When a color conversion layer rather than a transparent material layer is provided as the first color conversion layer 170A in a region corresponding to the first pixel 200A, the first color conversion layer 170A may include, for example, QDs to increase color purity of first-color light, for example, blue light of the first pixel 200A, but an embodiment is not limited thereto.

It has been described that each of the unit pixels of the micro LED displays 100 and 200 includes a plurality of pixels of different colors, for example, first to third pixels of different colors. Here, a single unit pixel includes only one pixel with respect to the same color. However, an embodiment is not limited thereto, and thus two or more pixels of the same color may be included in a single unit pixel.

As described above, the micro LEDs 50 may be aligned in one direction by adjusting a size of an opening of a transfer mold by using a maximum width difference between upper and lower surfaces of the micro LED 50, and thus transfer for aligning the micro LEDs 50 may be efficiently performed. For example, when the upper and lower surfaces of the micro LED 50 are circular or hexagonal, an opening having a diameter that is less than that of the wider surface between the upper and lower surfaces is formed, so that only micro LEDs aligned by one surface may be selected.

According to a method of aligning micro LEDs according to an embodiment and a method of manufacturing a micro LED display using the same, micro LEDs are transferred to a transfer substrate in which a transfer mold is formed, which has an array of openings that are capable of accommodating a first surface of the micro LED and do not accommodate a second surface of the micro LED, and thus the micro LEDs may be aligned so that only the first surface of each of the micro LEDs may be positioned within the opening. Thus, the micro LEDs may be aligned in one direction through a transfer process.

Furthermore, since the micro LED may be inserted into the opening of the transfer mold such that only a partial thickness of the micro LED including the first surface may be inserted into the opening, thereby preventing misalignment such as the case where the micro LED is reversely inserted into the opening.

It should be understood that example embodiments described herein should be considered in a descriptive sense only and not for purposes of limitation. Descriptions of features or aspects within each example embodiment should generally be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A method of aligning light-emitting diodes (LEDs), the method comprising:
    providing micro LEDs, each of the micro LEDs having a first surface that has a first maximum width D1 and a second surface that is opposite to the first surface and has a second maximum width D2 that is greater than the first maximum width D1;
    providing a transfer substrate including a transfer mold that has an array of openings, each of the openings being configured to accommodate the first surface of a corresponding micro LED and not accommodate the second surface of the corresponding micro LED; and
    aligning the micro LEDs in one direction in the openings of the transfer mold by inserting the micro LEDs into the openings of the transfer mold so that the first surface of each of the micro LEDs is positioned within a corresponding opening,
    wherein a third maximum width of each of the openings is less than the second maximum width D2 of the second surface of each of the micro LEDs and greater than the first maximum width D1 of the first surface of each of the micro LEDs.

2. The method of claim 1, wherein the aligning of the micro LEDs in the one direction in the openings of the transfer mold is repeated until none of the openings are empty or until none of the micro LEDS are misaligned with respect to the openings.

3. The method of claim 2, wherein the aligning of the micro LEDs in the one direction in the openings of the transfer mold comprises removing at least one micro LED that is misaligned.

4. The method of claim 1, wherein a depth of each of the openings is less than a thickness of each of the micro LEDs.

5. The method of claim 1, wherein a shape of a cross-section of each of the openings corresponds to a shape of a cross-section of each of the micro LEDs.

6. The method of claim 1, wherein each of the micro LEDs has a slanted side surface connecting the first surface and the second surface.

7. The method of claim 6, wherein each of the micro LEDs has a core-shell structure.

8. The method of claim 7, wherein the slanted side surface of each of the micro LEDs has an inclination angle of about 58 degrees or about 62 degrees.

9. The method of claim 1, wherein a maximum width of each of the micro LEDs taken along an intermediate thickness cross-section thereof is Dc,
    a maximum width of each of the openings is Dt, and
    the micro LEDs and the openings satisfy: $D1<Dc<Dt<D2$ and $0<Dt-Dc<D2-Dc$.

10. The method of claim 9, wherein each of the openings is further configured to accommodate the corresponding micro LED to a depth equivalent to at least half a thickness of the corresponding micro LED.

11. The method of claim 9, wherein a thickness of each of the micro LEDs from the first surface to the second surface is HLED, and a value (D2−Dc)/HLED is about 0.312435 or about 0.265855.

12. The method of claim 1, wherein the micro LEDs are micro LED flakes, and
wherein the aligning of the micro LEDs comprises placing the micro LED flakes on the transfer substrate so that the first surface of each of the micro LED flakes is inserted into the corresponding opening of the transfer mold.

13. A method of manufacturing a light-emitting diode (LED) display, the method comprising:
forming a display including unit pixels by aligning micro LEDs in one direction on a transfer substrate, the aligning the micro LEDs comprising:
providing the micro LEDs, each of the micro LEDs having a first surface that has a first maximum width D1 and a second surface that is opposite to the first surface and has a second maximum width D2 that is greater than the first maximum width D1;
providing the transfer substrate including a transfer mold that has an array of openings, each of the openings being configured to accommodate the first surface of a corresponding micro LED and not accommodate the second surface of the corresponding micro LED; and
aligning the micro LEDs in the one direction in the openings of the transfer mold by inserting the micro LEDs into the openings of the transfer mold so that the first surface of each of the micro LEDs is positioned within a corresponding opening,
wherein a third maximum width of each of the openings is less than the second maximum width D2 of the second surface of each of the micro LEDs and greater than the first maximum width D1 of the first surface of each of the micro LEDs.

14. The method of claim 13, further comprising forming, on the openings of the transfer mold in which the micro LEDs are aligned, a color conversion layer for converting a wavelength of light emitted by the micro LEDs,
wherein the transfer substrate is a display substrate.

15. The method of claim 14, wherein the color conversion layer is formed so that each of the unit pixels includes a plurality of pixels of different colors.

16. A method of manufacturing a light-emitting diode (LED) display, the method comprising:
providing micro LEDs, each of the micro LEDs having a first surface that has a first maximum width D1 and a second surface that is opposite to the first surface and has a second maximum width D2 that is greater than the first maximum width D1;
providing a transfer substrate including a transfer mold that has an array of openings, each of the openings being configured to accommodate the first surface of a corresponding micro LED and not accommodate the second surface of the corresponding micro LED;
aligning the micro LEDs in one direction in the openings of the transfer mold by inserting the micro LEDs into the openings of the transfer mold so that the first surface of each of the micro LEDs is positioned within a corresponding opening; and
forming a plurality of unit pixels by transferring the micro LEDs aligned in the one direction on the transfer substrate to a display substrate through bonding,
wherein a third maximum width of each of the openings is less than the second maximum width D2 of the second surface of each of the micro LEDs and greater than the first maximum width D1 of the first surface of each of the micro LEDs.

17. The method of claim 16, further comprising forming, on the display substrate to which the micro LEDs are transferred, a color conversion layer for converting a wavelength of light emitted by the micro LEDs.

18. The method of claim 17, wherein the color conversion layer is formed so that each of the unit pixels includes a plurality of pixels of different colors.

19. A micro light-emitting diode (LED) display comprising:
micro LEDs, each of the micro LEDs having a first surface that has a first maximum width D1 and a second surface that is opposite to the first surface and has a second maximum width D2; and
a transfer substrate including a transfer mold that has an array of openings, each of the openings being configured to accommodate the first surface of a corresponding micro LED and not accommodate the second surface of the corresponding micro LED, and the micro LEDS being inserted and aligned in one direction in the openings of the transfer mold so that the first surface of each of the micro LEDs is positioned within a corresponding opening,
wherein a third maximum width of each of the micro LEDs along an intermediate thickness cross section thereof is Dc, and a fourth maximum width of each of the openings is Dt,
wherein the micro LEDs and the openings satisfy: D1<Dc<Dt<D2 and 0<Dt−Dc<D2−Dc, and
wherein the transfer substrate is a display substrate configured to form a plurality of unit pixels.

20. The method of claim 1, wherein an intermediate thickness cross-section through a midpoint between the first surface and the second surface is smaller than a maximum width of each of the openings.

* * * * *